US012413219B2

(12) United States Patent
Simony

(10) Patent No.: US 12,413,219 B2
(45) Date of Patent: Sep. 9, 2025

(54) DIFFERENTIAL COMPARATOR CIRCUIT

(71) Applicant: STMicroelectronics (Grenoble 2) SAS, Grenoble (FR)

(72) Inventor: Laurent Simony, Grenoble (FR)

(73) Assignee: STMicroelectronics (Grenoble 2) SAS, Grenoble (FR)

(*) Notice: Subject to any disclaimer, the term of this patent is extended or adjusted under 35 U.S.C. 154(b) by 32 days.

(21) Appl. No.: 18/541,324

(22) Filed: Dec. 15, 2023

(65) Prior Publication Data

US 2024/0213972 A1  Jun. 27, 2024

(30) Foreign Application Priority Data

Dec. 21, 2022 (EP) ...................................... 22306981

(51) Int. Cl.
| | |
|---|---|
| *H03K 5/24* | (2006.01) |
| *H03M 1/56* | (2006.01) |
| *H04N 25/772* | (2023.01) |
| *H04N 25/778* | (2023.01) |

(52) U.S. Cl.
CPC ......... *H03K 5/2481* (2013.01); *H04N 25/772* (2023.01); *H04N 25/778* (2023.01); *H03M 1/56* (2013.01)

(58) Field of Classification Search
None
See application file for complete search history.

(56) References Cited

U.S. PATENT DOCUMENTS

| 5,986,599 | A | * | 11/1999 | Matsuo | ..................... | H03K 5/24 |
|---|---|---|---|---|---|---|
| | | | | | | 341/158 |
| 2011/0205098 | A1 | | 8/2011 | Sabut et al. | | |
| 2020/0244907 | A1 | * | 7/2020 | Ueno | ..................... | H04N 25/78 |
| 2021/0297622 | A1 | | 9/2021 | Segami et al. | | |
| 2022/0209970 | A1 | | 6/2022 | Hurwitz | | |

FOREIGN PATENT DOCUMENTS

| CN | 109587420 A | 4/2019 |
|---|---|---|
| EP | 1142126 B1 | 3/2005 |

OTHER PUBLICATIONS

EPO Partial Search Report and Written Opinion for priority application, EP 22306981, report dated Jun. 7, 2023, 11 pgs.
EPO Search Report and Written Opinion for priority application, EP 22306981, report dated Jul. 31, 2023, 13 pgs.

* cited by examiner

*Primary Examiner* — Mark T Monk
(74) *Attorney, Agent, or Firm* — Crowe & Dunlevy LLC

(57) ABSTRACT

A differential comparator circuit includes a voltage amplifier of negative gain receiving an analog input signal and generating an inverted analog input signal. The analog input signal and the inverted analog input signal form differential analog input signals. A comparator input circuit includes a first capacitive divider to generate a first signal as an average of the analog input signal and a first ramp signal, and a second capacitive divider to generate a second signal as an average of the inverted analog input signal and a second ramp signal, with the first and second ramp signals being differential ramp signals. The comparator is configured to compare the first and second signals to generate a signal transition having a timing based on the input signal.

14 Claims, 10 Drawing Sheets

DIFFERENTIAL COMPARATOR CIRCUIT

PRIORITY CLAIM

This application claims the priority benefit of European Application for Patent No. 22306981.6, filed on Dec. 21, 2022, the content of which is hereby incorporated by reference in its entirety to the maximum extent allowable by law.

TECHNICAL FIELD

The present disclosure relates generally to analog to digital converters (ADCs) and electronic circuits comprising such ADCs.

BACKGROUND

ADCs are used to transform analog signals to digital signals in a variety of circuits, including for example in image sensors. In this application, the ADC is often implemented by a ramp converter, which comprises a comparator for each column of the pixel array of the image sensor. The comparator is configured to compare the signal from the pixel, which is capacitively coupled to the comparator, with a ramp signal from a ramp generator, which is also capacitively coupled to the comparator. The switching time of the comparator represents the result of the analog to digital conversion. This switching time is converted into a digital value, for example by a time to digital converter, such as a counter.

It would be desirable to provide a low power ADC capable of operating with a low voltage supply, for example in the region of 2 V or less. It would also be desirable, for some applications, to increase the signal swing of the input signal that can be converted, without increasing the supply voltage. However, a drawback of existing ADCs is that the voltage swing of the input signal that can be converted is limited by the supply voltage.

Furthermore, it would be desirable to provide a low noise solution.

There is a need in the art to address all or some of the drawbacks of known differential comparator circuits.

SUMMARY

One embodiment provides a differential comparator circuit including: a voltage amplifier of negative gain configured to receive an analog input signal and to generate an inverted analog input signal, wherein the analog input signal and the inverted analog input signal form differential analog input signals; and a comparator input circuit. The comparator input circuit includes: a first capacitive divider configured to generate a first signal as an average of the analog input signal and a first ramp signal; and a second capacitive divider configured to generate a second signal as an average of the inverted analog input signal and a second ramp signal, wherein the first and second ramp signals are differential ramp signals, with the comparator being configured to compare the first signal with the second signal in order to generate a signal transition having a timing based on the analog input signal.

One embodiment provides a method of differential comparison including: receiving, by a voltage amplifier of negative gain, an analog input signal and generating, by the voltage amplifier, an inverted analog input signal, wherein the analog input signal and the inverted analog input signal form differential analog input signals; generating, by a first capacitive divider of a comparator input circuit, a first signal as an average of the analog input signal and a first ramp signal; generating, by a second capacitive divider of the comparator input circuit, a second signal as an average of the inverted analog input signal and a second ramp signal, wherein the first and second ramp signals are differential ramp signals; and comparing, the first input signal with the second signal to generate a signal transition at a time based on the analog input signal.

According to an embodiment, the voltage amplifier may be a capacitive voltage amplifier having a negative unitary gain.

According to an embodiment, the voltage amplifier may include: an amplifying stage having an inverting input; an input capacitor coupled between an input of the voltage amplifier receiving the analog input signal and the inverting input; and a feedback capacitor coupled between the inverting input and an output of the voltage amplifier providing the inverted analog input signal; wherein the input capacitor and the feedback capacitor having capacitances that are equal or substantially equal to each other.

According to an embodiment, the voltage amplifier includes a reset switch activated by a control unit, and coupled between the inverting input of the amplifying stage of the voltage amplifier and the output of the voltage amplifier.

According to an embodiment, the first capacitive divider includes: a first capacitor coupled between a first input node of the comparator input circuit receiving the analog input signal and a first output of the comparator input circuit providing the first signal; and a second capacitor coupled between a second input node of the comparator input circuit receiving the first ramp signal and the first output of the comparator input circuit. In this embodiment, the second capacitive divider includes: a third capacitor coupled between a third input node of the comparator input circuit receiving the inverted analog input signal and a second output of the comparator input circuit providing the second signal; and a fourth capacitor coupled between a fourth input node of the comparator input circuit receiving the second ramp signal and the second output of the comparator input circuit, wherein the first, second, third and fourth capacitors all have the same, or substantially the same, capacitance.

According to an embodiment, the comparator includes: an amplifier having an inverting input configured to receive the first signal, and a non-inverting input configured to receive the second signal; and an initialization circuit. The initialization circuitry is configured to apply: a common mode voltage to the non-inverting input of the amplifier of the comparator; and the common mode voltage between the inverting input and an output of the amplifier of the differential comparator circuit.

One embodiment provides an electronic circuit having: an image sensor formed of an array of pixels; and a such differential comparator circuit, wherein the analog input signal is a pixel output signal of one of the pixels of the matrix.

One embodiment provides a differential amplifier circuit having: a swapping circuit adapted to couple, during a first time period, a first capacitor between a first input node and a common node and a second capacitor between a second node and the common node, and to couple, during a second time period, the first capacitor between the second node and the common node and the second capacitor between the first input node and the common node. The swapping circuit includes: a first switch coupled between the first input node and a first electrode of the first capacitor; a second switch coupled between the second node and the first electrode of the first capacitor; a third switch coupled between the second node and a first electrode of the second capacitor; and a fourth switch coupled between the first node and the first electrode of the second capacitor. A second electrode of the first capacitor and a second electrode of the second capacitor are coupled to the common node. A control circuit may be configured: to control, during the first time period, the first and third switches to be conductive and the second and fourth switches to be non-conductive; and to control, during the second time period, the second and fourth switches to be conductive and the first and third switches to be non-conductive, such that the roles of the first and second capacitors are swapped between the first and second time periods.

According to an embodiment, the control circuit is adapted to control the switches over a succession of time periods, wherein during each time period of the succession, the control circuit is adapted to perform the control of the first, second, third and fourth switches to select, pseudo-randomly, either a switch configuration corresponding to the first time period or a switch configuration corresponding to the second time period, the selection being kept constant during each time period.

According to an embodiment, the first and second capacitors coupled to the swapping circuit are the first and second capacitors respectively of the first capacitive divider; and the first node of the swapping circuit is the first input node configured to receive the analog input signal, the second node of the swapping circuit is the second input node configured to receive the first ramp signal, and the common node of the swapping circuit is the first output providing the first signal. The first and second capacitors coupled to the second swapping circuit are the third and fourth capacitors respectively of the second capacitive divider. The first node of the second swapping circuit is the third input node configured to receive the inverted analog input signal, the second node of the swapping circuit is the fourth input node configured to receive the second ramp signal, and the common node of the swapping circuit is the second output providing the second signal.

According to an embodiment, the voltage amplifier is implemented by a such differential amplifier circuit, including: the first capacitor coupled to the swapping circuit is the input capacitor; the second capacitor coupled to the swapping circuit is the feedback capacitor; and the first node of the swapping circuit is the input of the voltage amplifier receiving the analog input signal, the second node of the swapping circuit is the output of the voltage amplifier providing the inverted analog input, and the common node of the swapping circuit is the inverting input.

One embodiment provides an electronic circuit comprising at least a first comparator as described above and a second comparator as described above, wherein the electronic circuit comprises a matrix of pixels, the analog input signal of the first comparator being provided by a first pixel of a first column of the matrix, and the analog input signal of the second comparator being provided by a second pixel of a second column of the matrix.

One embodiment provides an analog to digital converter comprising a such differential comparator circuit and a time to digital converter configured to generate a digital output signal based on the timing of the signal transition.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
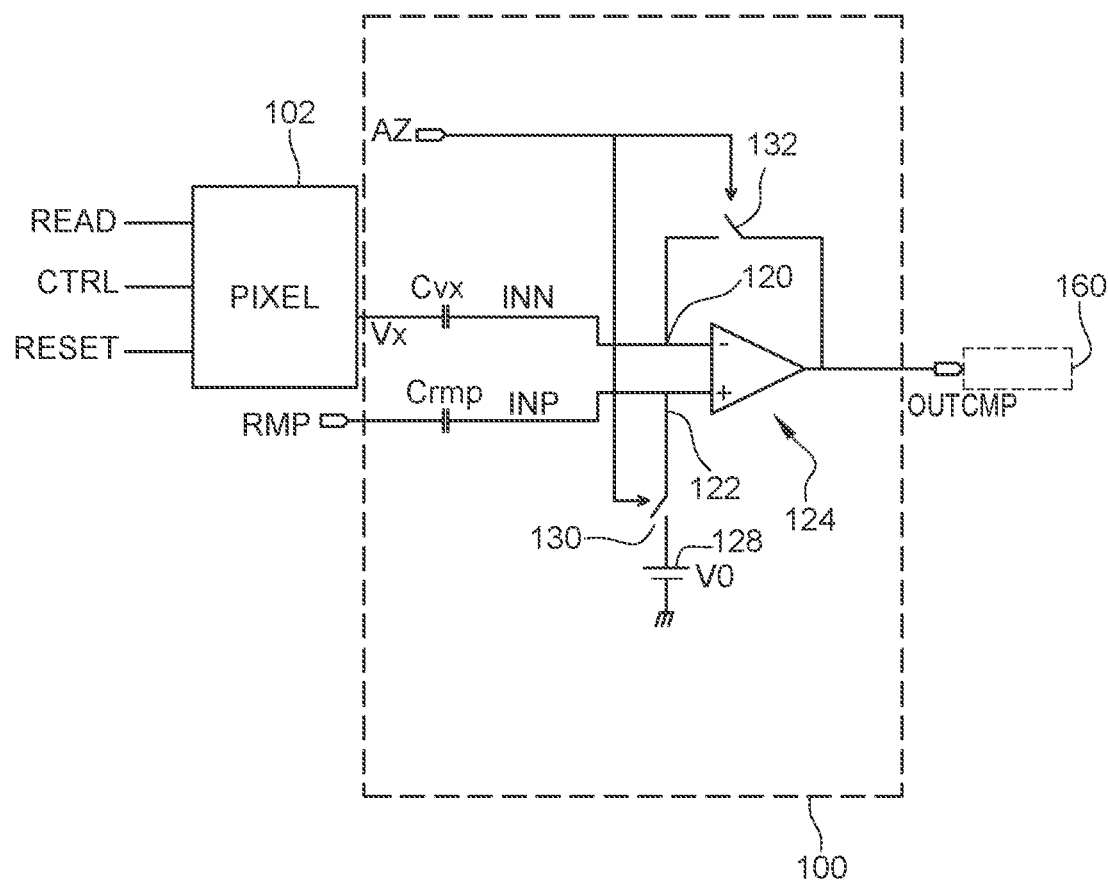
FIG. 1 schematically illustrates a differential comparator coupled to a pixel.

FIG. 1 schematically illustrates an example of a differential comparator 100 coupled to a pixel 102. The pixel 102 may be part of an array of pixels arranged in rows and columns. Each column of pixels comprises, for example, a corresponding comparator, and the pixel values are for example read row by row. The pixel 102 in the example of FIG. 1 comprises inputs receiving control signals: READ, RESET, and in some cases one or more further control signals CTRL. The pixel 102 is for example reset in order to initiate an integration phase of the pixel 102. In particular, the pixel 102 for example comprises a photosensitive device (not illustrated), that generates an electrical signal as a function of the light intensity received by the pixel 102. The one or more control signals CTRL are for example used to time the end of the integration phase of the pixel 102, causing a pixel signal to be generated within the pixel and outputted on an output line so that it can be read. To read the value of the pixel signal at the end of the integration period, the READ signal is activated, causing an analog pixel voltage Vx, representing the light intensity, to be provided at an output of the pixel. The RESET input is then for example activated to reset the pixel before a subsequent integration period.

The example comparator 100 of FIG. 1 is implemented by a differential comparator circuit configured to compare the analog pixel voltage Vx provided at a first comparator input with a ramp signal RMP provided at a second comparator input. The first comparator input is capacitively coupled, via a capacitor Cvx, to an inverting input 120, noted "−", of an amplifier 124 of the comparator 100. The inverting input 120 receives a first comparator input signal INN. The second comparator input is capacitively coupled, via a capacitor Crmp, to a non-inverting input 122, noted "+", of the amplifier 124 of the comparator 100. The non-inverting input 122 receives a second comparator input signal INP. The ramp signal RMP for example comprises a sequence of voltage levels including one or several ramps successively in time. A voltage source 128 supplying a voltage V0 is coupled to the input 122 of the amplifier 124 via a switch 130, which is controlled by a reinitialization signal AZ. An output of the amplifier 124 provides a comparator output signal OUTCMP of the comparator 100, and is coupled to the inverting input 120 via a switch 132 also controlled by the reinitialization signal AZ.

The comparator output signal OUTCMP comprises a signal transition having a timing based on the analog pixel voltage Vx. In particular, the timing of the signal transition is a function of the relative levels of the ramp signal RMP and the analog input signal Vx and the signal transition occurs in particular when the signals INN and INP cross. As well known by those skilled in the art, the timing of this transition can be processed by a time to digital converter 160, such as a counter and/or other circuitry, in order to generate a digital output value. The differential comparator 100 and the time to digital converter 160, as well as the ramp generator (not illustrated in FIG. 1) used for generating the ramp signal RMP, together form an analog to digital converter.

Figure 2:
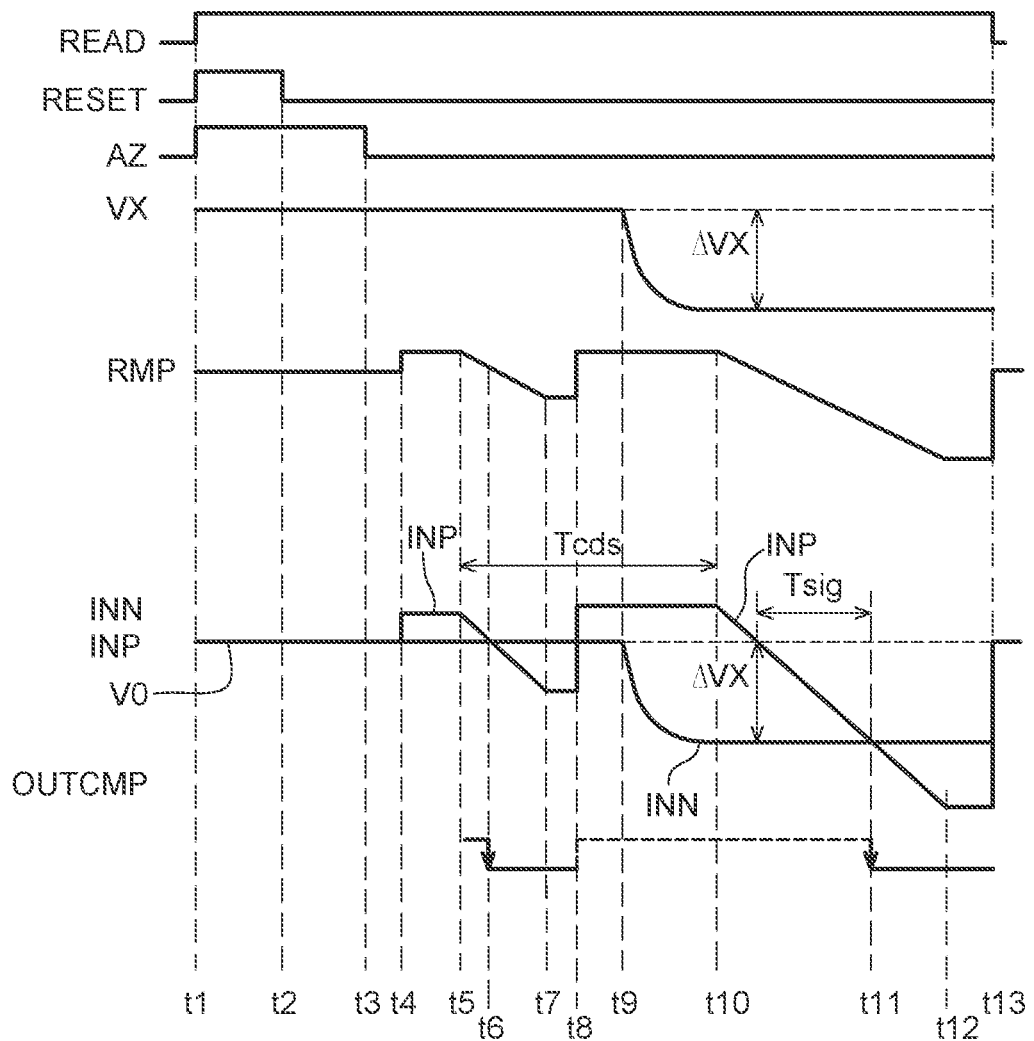
FIG. 2 is a timing diagram representing operation of the differential comparator of FIG. 1.

FIG. 2 is a timing diagram representing operation of the differential comparator 100 of FIG. 1.

Initially, the pixel voltage Vx and the signal ramp RMP are for example at a reference level prior to the read signal being asserted.

At a time t1, the read signal READ of the pixel 102 is activated to a high state and for example remains at this high state throughout the conversion operation. At the time t1, the RESET signal of the pixel 102, and the reinitialization signal AZ controlling the reinitialization switches 130 and 132 of the comparator 100, are also activated to a high state. This causes the first comparator input signal INN, the second comparator input signal INP, and the comparator output signal OUTCMP, to be initialized to a same voltage V0 provided by the voltage source 128. In the example of FIG. 2, READ, RESET and AZ signals rise at the same time, but in other examples, they might rise at different times.

At a time t2, the RESET signal of the pixel is set to a low level, and at a time t3, the reinitialization signal AZ is set to a low level, starting the reading process. These signals for example remain at the low level throughout the rest of the conversion operation.

At a time t4, the signal INP is increased to an initial level above V0 until a time t5. Between the time t4 and a time t9, the signal INN is close to V0.

At the time t5, the ramp signal RMP, and thus the signal INP, comprises a negative ramp decreasing until a time t7. The comparator 100 compares the pixel signal Vx with the ramp signal RMP, and when, at a time t6, the ramp present on the signal INP becomes equal to the level of the signal INN, the output signal OUTCMP of the comparator 100 toggles from an initial level to an asserted level. In the example of FIG. 2, the initial level of the output signal OUTCMP is a high level, and the asserted level is a low level.

At the time t7, the negative ramping of the ramp signal RMP ends, and the ramp signal RMP for example remains constant until a time t8, at which point it is brought back to the initial level and remains constant until a time t10. In an alternative example, the ramp signal RMP is brought straight back to the initial level at the time t7, in other words t8 is equal to t7.

At the time t9, the pixel is read by asserting one of the further control signals CTRL, and the pixel output Vx falls by a voltage difference ΔVX, which is a function of the signal captured by the pixel. Thus, the voltage at the first input INN falls by a corresponding voltage difference ΔVX, and then remains constant.

At the time t10, the ramp signal RMP comprises a second negative ramp, for example with an amplitude larger than the maximum possible pixel swing, in other words the maximum value of the voltage difference ΔVX. The second negative ramp decreases until a time t12, and then for example remains constant. At a time t13, the signal INP is brought back to V0 by asserting the AZ signal.

When the second negative ramp crosses the voltage at the input INN at a time t11, the output voltage of the ADC 100 toggles again to the asserted level.

A time to digital converter is for example configured to evaluate the time interval Tsig, representative of the pixel voltage difference ΔVX. The time interval Tsig is equal to t11-t6 Tcds (i.e., the difference between time t11 and time t6, measured in Tcds), where Tcds is a fixed correlated double sampling (cds) time interval corresponding to the interval between t5 and t10. In other words, Tsig is given by the difference between the times at which the output signal OUT1 of the comparator 100 toggles and by then subtracting Tcds.

A difficulty with the implementation of FIG. 1 is that the pixel swing that can be converted by the comparator is limited to a value of less than the supply voltage. Indeed, it can be noted from FIG. 2 that the common mode of the input signals INN, INP is variable, and thus the differential comparator circuit of the comparator 100 performs the comparison at a variable common mode that depends on the pixel voltage difference ΔVX. This means that if the supply voltage is relatively low, for example equal to around 1 V, the pixel swing can be limited to around 0.8 V, which is not sufficient for some applications, which require a pixel swing up to 1.5V.

First Aspect—Differential Ramp Conversion

Figure 3:
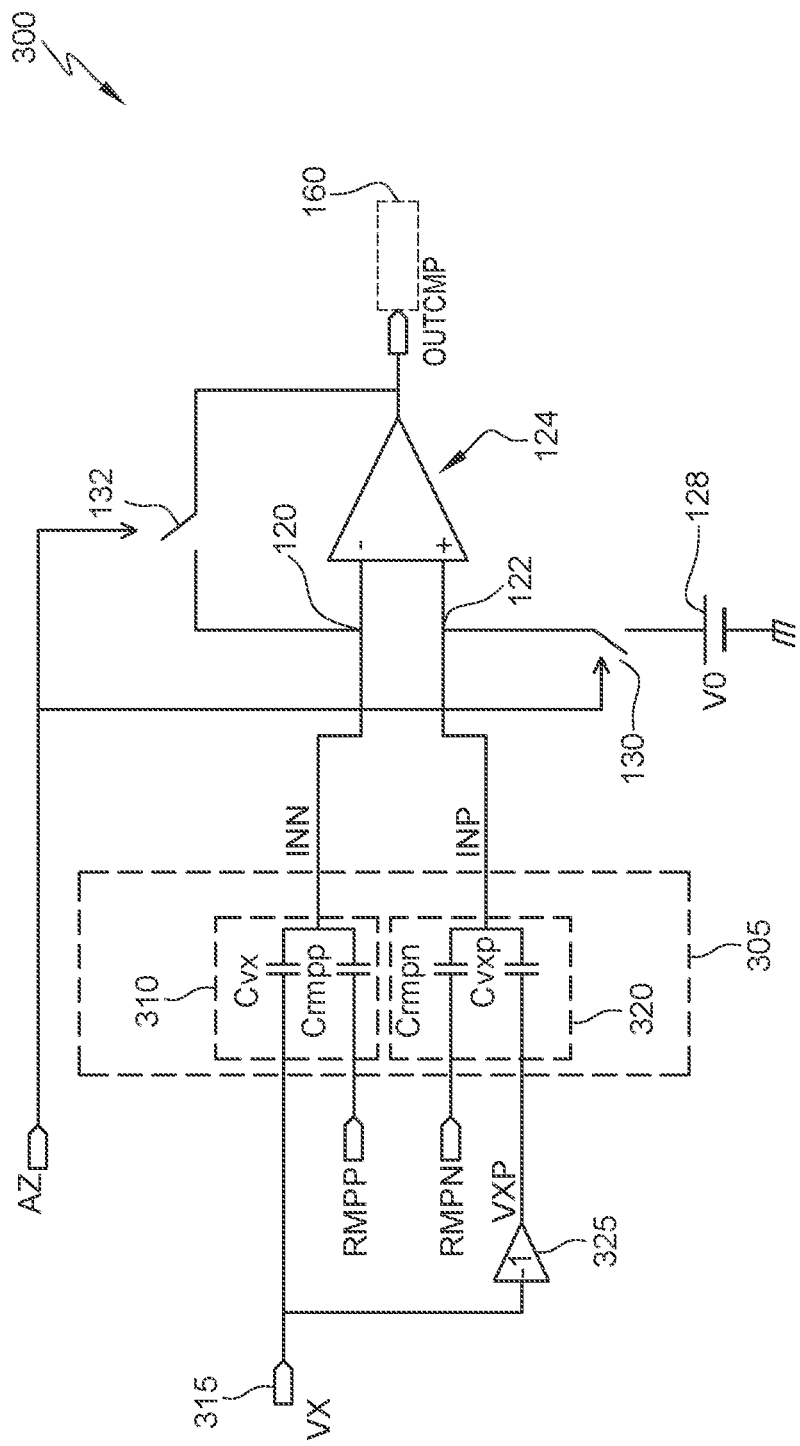
FIG. 3 schematically illustrates a differential comparator.

FIG. 3 schematically illustrates a differential comparator 300.

The differential comparator 300 of FIG. 3 has some features in common with the differential comparator 100 of FIG. 1, and like features are labelled with like reference numerals and will not be described again in detail. However, the differential comparator 300 additionally comprises a voltage amplifier 325 for example having negative unitary gain, and a comparator input circuit 305 having additional capacitors with respect to the one of the comparator 100. The comparator input circuit 305 and the input signals applied to the circuit 305 are configured such that the common mode of the comparator input signals INN and INP and of the differential comparator 300 is fixed, for example at a V0 level of VDD/2, as will be explained in more detail below.

Whereas in FIG. 1 the voltage signals INN and INP at the input of the amplifier 124 are each single-ended signals, in the embodiment of FIG. 3, the signals INN and INP are differential signals. As a definition, differential signals are signals present at two nodes having a same magnitude but being opposite in polarity with respect to a fixed common mode potential, which is the voltage V0 in the example of FIG. 3, where for example V0=VDD/2, and VDD is the supply voltage of the amplifier 124. The comparator input circuit 305 for example supplies the differential signals INN and INP based on a pair of differential input signals VX and VXP, and on a pair of differential ramp signals RMPP, RMPN.

The analog input signal VX is for example the pixel output voltage, like in the example of FIGS. 1 and 2, which is received at an input 315 of the comparator 300. The input signal VXP is generated to have an opposite signal swing with respect to signal swing of the signal VX. For example, the input signal VXP is generated by the voltage amplifier 325 based on the input signal VX, the voltage amplifier 325 having its input coupled to the input 315 of the comparator 300.

The ramp signal RMPN is for example similar to the ramp signal RMP of the example of FIGS. 1 and 2, and the ramp signal RMPP is for example the mirror opposite of the ramp signal RMPN. The ramp signal RMPP, and consequently the ramp signal RMPN, comprise, for example, one or more voltage ramps successively in time, which may have positive or negative slopes. Those skilled in the art will understand how differential ramps signals can be generated. For example, while not illustrated in FIG. 3, the ramp signals RMPN and RMPP could each be generated by digital to analog converters (DACs) based on digital ramp signals, or the ramp signal RMPP could be generated by a DAC, and the ramp signal RMPN generated by a voltage amplifier of negative unitary gain. It would also be possible to use a single steering current DAC, and use both complementary outputs to provide the differential ramp signals RMPP and RMPN.

According to the example of FIG. 3, the comparator input circuit 305 is configured to provide, at the input INN, an average of the signals VX and RMPP, and at the input INP, an average of the signals VXP and RMPN. For example, the comparator input circuit 305 comprises a first capacitive divider 310 comprising the series connection of capacitors Cvx and Crmpp between the input nodes receiving the signals VX and RMPP, an intermediate node between these capacitors providing the signal INN. Similarly, the comparator input circuit 305 for example comprises a second capacitive divider 320 comprising the series connection of capacitors Cvxp and Crmpn between the input nodes receiving the signals VXP and RMPN, an intermediate node between these capacitors providing the signal INP.

Figure 4:
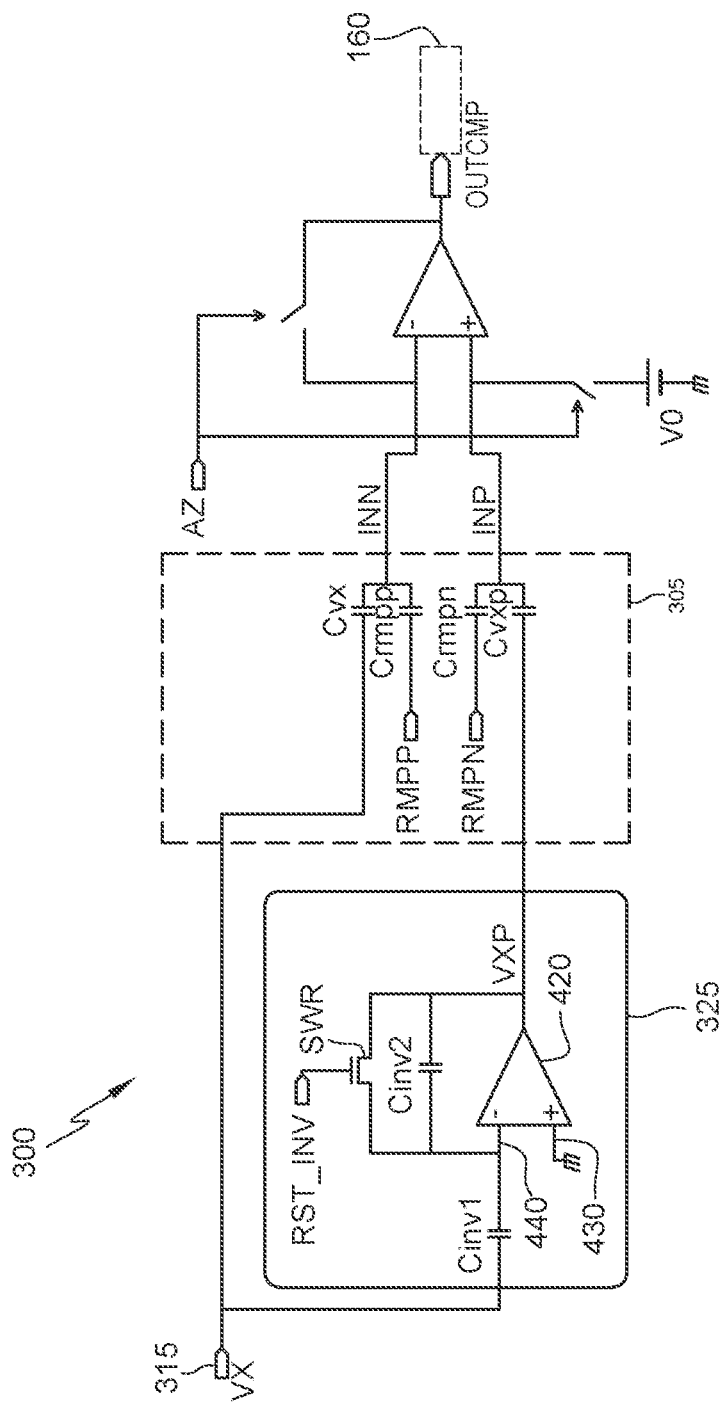
FIG. 4 schematically illustrates the differential comparator of FIG. 3 with an example implementation of a negative unitary gain amplifier.

FIG. 4 schematically illustrates the comparator 300 with an example implementation of the capacitive voltage amplifier 325 of negative gain for generating the signal VXP based on the signal VX. The capacitive voltage amplifier 325 receives at an input the pixel voltage signal VX, and provides at an output the differential signal VXP corresponding to the inverted version of the signal VX.

According to the example of FIG. 4, the capacitive voltage amplifier 325 comprises an amplifying stage 420 with an inverting input 440, which is coupled to the input 315 of the comparator 300 via a capacitor Cinv1, and a non-inverting input 430, which is coupled to a reference potential 430. A feedback capacitor Cinv2 couples, for example, the output of the amplifying stage 420 to the inverting input 440 of the amplifying stage 420. The input capacitor Cinv1 and the feedback capacitor Cinv2 have, for example, capacitances that are equal or substantially equal to each other, such that the capacitive voltage amplifier 325 has a negative unitary gain. For example, in some embodiments, any difference between the capacitances of the capacitors Cinv1 and Cinv2 results only from manufacturing tolerances. The capacitive voltage amplifier 325 comprises, for example, a reset switch SWR controlled by a control signal RST_INV, which is for example supplied by a control circuit (not illustrated). The reset switch SWR for example couples the inverting input 440 of the amplifying stage 420 to the output of the capacitive voltage amplifier 325.

Figure 5:
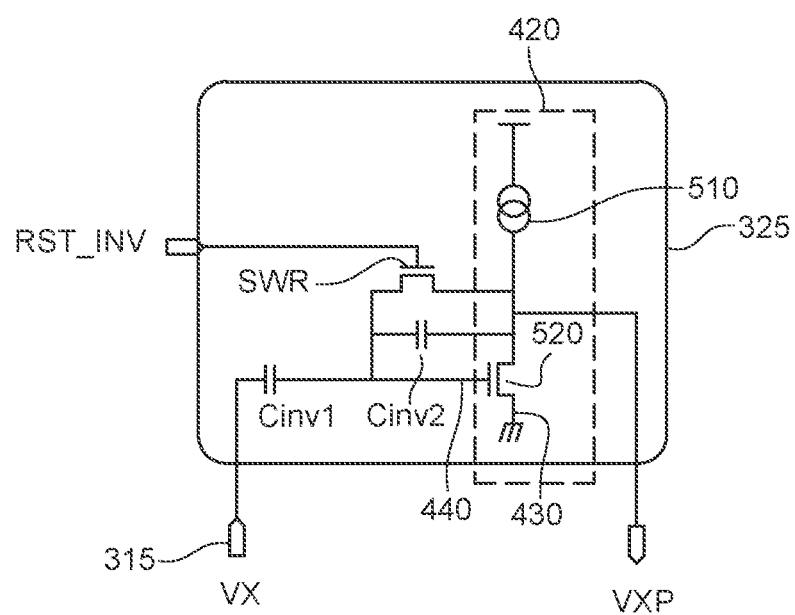
FIG. 5 schematically illustrates the negative unitary gain amplifier of FIG. 4 in more detail.

FIG. 5 schematically illustrates the negative unitary gain amplifier 325 of FIG. 4 in more detail, and illustrates in particular an example in which it is implemented by a capacitive voltage amplifier. According to the example of FIG. 5, the amplifying stage 420 of the amplifier 325 comprises a current source 510 coupled in series with a transistor 520 between a supply voltage rail and the reference potential, for example corresponding to the ground potential. For example, the current source 510 is coupled to the drain of the transistor 520. The gate of the transistor 520 corresponds for example to the inverting input 440 of the amplifying stage 420. The source of the transistor 520 is for example coupled to the reference potential, and corresponds to the non-inverting input 430 of the amplifying stage 420. In another example, the transistor 520 is a common source transistor which is cascoded in order to increase its output impedance and thus obtain a higher open loop gain.

Figure 6:
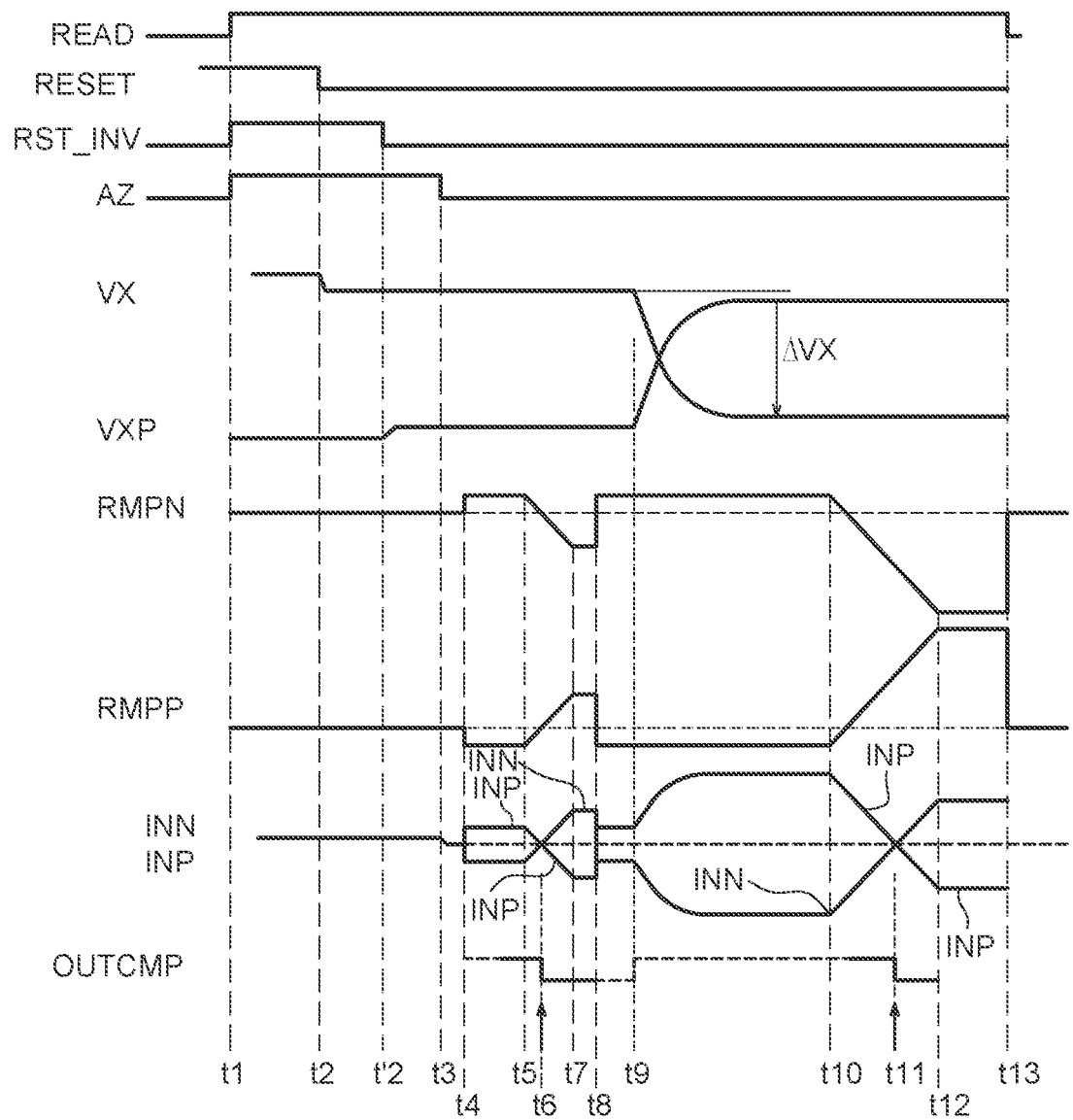
FIG. 6 is a timing diagram representing signals in the differential comparator of FIG. 4 during a conversion operation.

FIG. 6 is a timing diagram representing an example of signals in the differential comparator 300 of FIG. 3 during a conversion operation. The example of FIG. 6 is related to a case where the electronic circuit, to which the comparator is coupled, is a pixel of an image sensor, such as in FIG. 1.

In FIG. 6, times t1 to t13 correspond to the times t1 to t13 of FIG. 2. The signals READ, RESET and AZ are controlled in the example of FIG. 6 in the same manner as in FIG. 2, and these signals will not be described again in detail.

At the time t1, the reset signal RST_INV of the reset switch SWR for example rises to a high level at the same time as the signals READ, RESET and AZ. In a non-illustrated example, the signals READ, RST_INV, AZ and RESET rise at different times.

At the time t2, the signal VX supplied on the first output slightly decreases as a consequence of the falling edge of the reset signal. The negative coupling of VX at time t2 will not be amplified because the signals RST_INV and AZ are at the high level at t2. The pixel voltage signal VX is then at a pixel reference level.

At a time t'2, which is for example between the times t2 and t3, the reset signal RST_INV of the reset switch SWR is brought low, causing the inverted pixel signal VXP at the output of the voltage amplifier 325 to slightly increase.

At the time t3, the reinitialization signal AZ is brought low, causing the signals INN, INP to slightly decrease. By bringing the reinitialization signal AZ low after the reset signals RESET and RST_INV have been brought low, the auto zero function takes into account the variations in VX and VXP at the times t2 and t'2.

The ramp signal RMPN is for example similar to the ramp signal RMP of FIG. 2 and the form of this ramp signal will not be described again in detail. The ramp signal RMPP is for example mirrored with respect the ramp signal RMPN.

Between the times t4 and t13, the pixel output signal provided on the first input VX has a similar aspect to the signal INN of FIG. 2 except that the signal at INN may undergo attenuation with respect VX and their DC level is different.

The averaged signals INN and INP obtained on INN with the first capacitive divider 310 and on INP with the second capacitive divider 320, cross each other, at the common mode level set by the AZ switch activation, a first time at the time t6 between times t5 and t7, and a second time at the time t11 between times t10 and t12. The time t11 corresponds, for example, to a second toggling time of the comparator 300.

A time to digital converter is for example configured to evaluate the time interval between the times t6 and t11 based on the comparator output signal OUTCMP in a similar manner to what is described in relation with FIG. 2. The fixed correlated double sampling (cds) time interval Tcds is calculated in a similar manner as in FIG. 2, since the ramp RMPN of FIG. 6 is similar to the ramp RMP of FIG. 2.

The comparator 300 of FIG. 3 is also compatible with a low voltage supply, such as a voltage supply of 1.8V, or even of 1.2V, to allow usage with advanced technology nodes. Conventional ADCs would not be able to operate with such a low voltage, because they perform the comparison at a variable common mode that depends on the input signal. On the contrary, the comparator 300 of FIG. 3 does not suffer from this issue, because it performs the comparison at a fixed common mode due to the differential signals formed at the comparator inputs.

Second Aspect—Overcoming Capacitor Mismatch

In circuits, such as the comparator 300 of FIG. 3, in which a ratio of capacitances defines an output level or gain of the circuit, capacitor mismatch can result in an undesirable vertical fixed pattern noise (VFPN) and gain variations at the output when the signal VX is different from 0, for example in the case of an illuminated image sensor. As known to those skilled in the art, VFPN is a random offset between columns in an image sensor. In particular, in the case that a comparator, like the comparator 300 of FIG. 3, is provided for each column of an image sensor, variations in the gain of each comparator, due to capacitance mismatch, will result in fixed pattern column noise. A solution for addressing this issue, which may be applied to the comparator 300 of FIG. 3 described above, or in other contexts, will now be described in more detail with reference to FIGS. 7 to 10.

Figure 7:
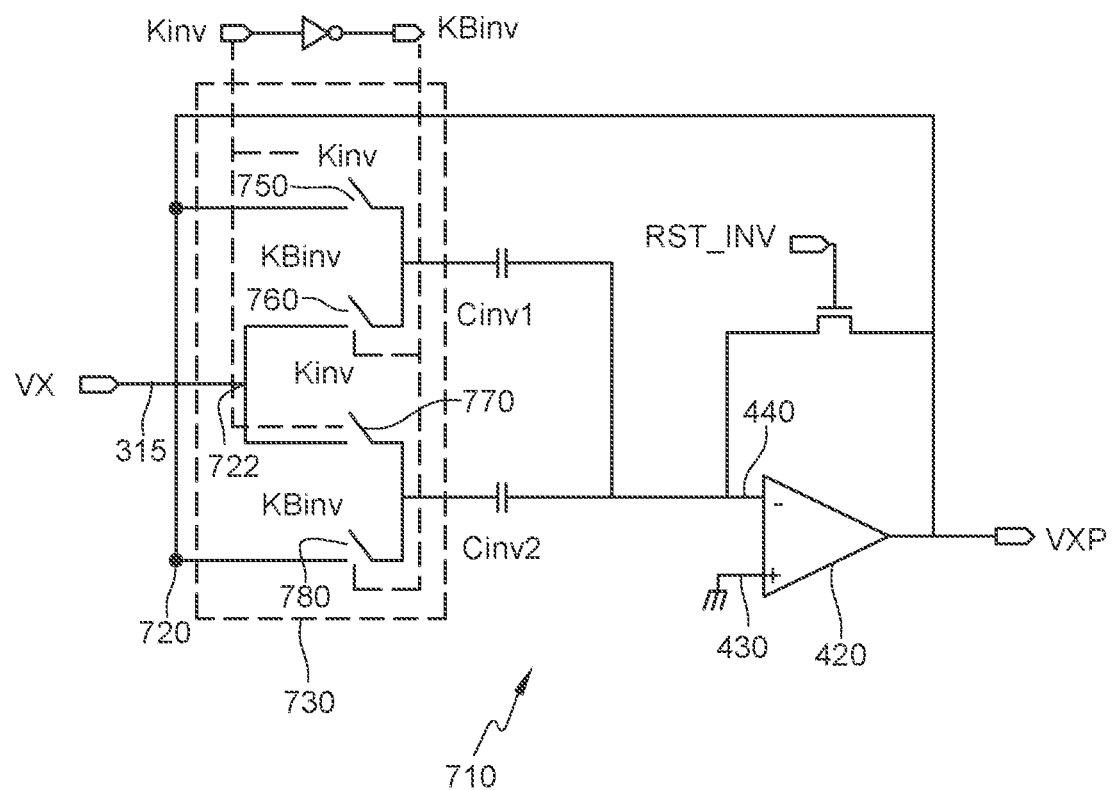
FIG. 7 schematically illustrates another example implementation of the negative unitary gain amplifier of FIG. 4.

FIG. 7 schematically illustrates an example implementation of the negative unitary gain amplifier 325 of FIG. 3 according to an alternative embodiment to that of FIG. 4.

The negative unitary gain amplifier 710 of FIG. 7 is similar to the negative unitary gain amplifier of FIG. 4, except that negative unitary gain amplifier 710 comprises a swapping circuit 730 for coupling input and feedback capacitors Cinv1, Cinv2 to first and second nodes. The swapping circuit comprises four switches controlled by a control circuit (not illustrated).

A first switch 750 of the swapping circuit 730 is controlled by a control signal Kinv, and is configured to couple the output of the amplifying stage 420 to a first electrode of the input capacitor Cinv1, the second electrode of which is coupled to the inverting input 440.

A second switch 760 of the swapping circuit 730 is controlled by a control signal KBinv, which corresponds to the inverse of the control signal Kinv. The second switch 760 is configured to couple the input 315 of the comparator 300, receiving the analog input signal VX, to the first electrode of the input capacitor Cinv1.

A third switch 770 of the swapping circuit 730 is controlled by the control signal Kinv, and is configured to couple the input 315 of the comparator 300, receiving the analog input signal VX, to a first electrode of the feedback capacitor Cinv2, the second electrode of which is coupled to the inverting input 440.

A fourth switch 780 of the swapping circuit 730 is controlled by the control signal KBinv, and is configured to couple the output of the amplifying stage 420 to the first electrode of the feedback capacitor Cinv2.

The input 315 is for example coupled to a node 722 common to the second and third switches 760, 770. The amplifying stage 420 output provides the inverted analog input signal VXP, which corresponds to another node 720 common to the first and fourth switches 750, 780.

The capacitors Cinv1 and Cinv2 are for example configured to have equal capacitances to each other, for example to within normal manufacturing tolerances.

The control circuit is, for example, configured to control, during a first time period corresponding for example to a read cycle of a first pixel of the pixel array, the switches of the swapping circuit 730 to have a first configuration in which they couple the capacitor Cinv1 between the nodes 722 and 440, and the capacitor Cinv2 between the nodes 720 and 440. The control circuit is, for example, configured to control, during a second time period corresponding for example to a read cycle of a second pixel of the pixel array, the switches of the swapping circuit 730 to have a second configuration in which they couple the capacitor Cinv1 between the nodes 720 and 440, and the capacitor Cinv2 between the nodes 722 and 440. Thus, the roles of the capacitors Cinv1 and Cinv2 are inversed between the first and second time periods.

Changing the configuration of the switches between periods allows an averaging over time, for example, of the gain errors generated on each column of the pixel array due to the capacitor mismatches.

Figure 8:
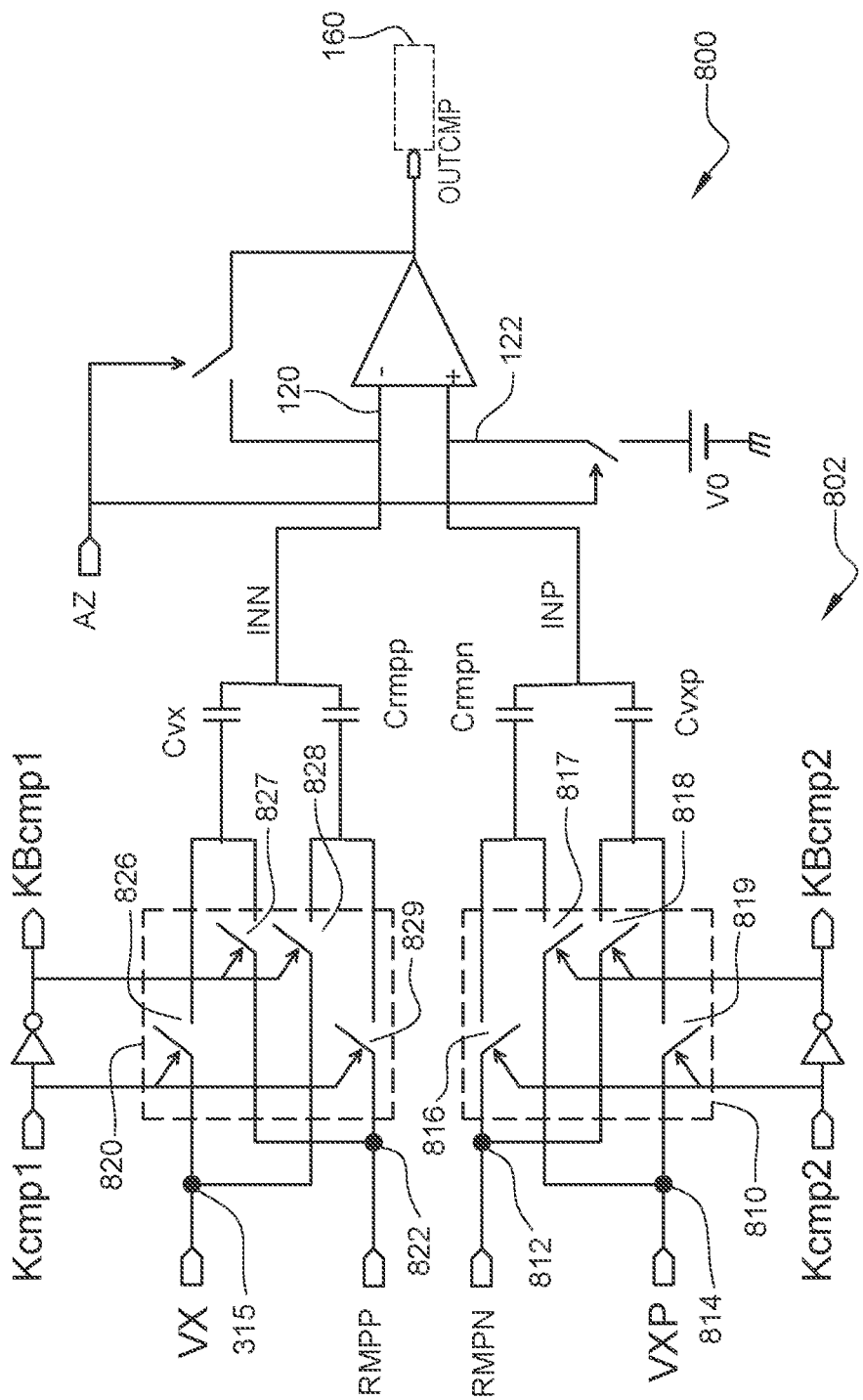
FIG. 8 schematically illustrates a differential comparator.

FIG. 8 schematically illustrates a comparator 800.

The comparator 800 of FIG. 8 is, for example, similar to the comparator 300 of FIG. 3 except that the comparator of FIG. 8 additionally comprises a swapping circuit 820 for swapping the roles of the capacitors Cvx and Crmpp, and a swapping circuit 810 for swapping the roles of the capacitors Cvxp and Crmpn. While not illustrated in FIG. 8, the comparator 800 for example comprises either the voltage amplifier 325 of FIG. 3, or the voltage amplifier 710 of FIG. 7, for generating the inverted analog input signal VXP.

In the example of FIG. 8, the ramp signal RMPP is provided to an input node 822, the ramp signal RMPN is provided to an input node 812, and the inverted analog input signal VXP is provided to an input node 814.

The swapping circuit 820 comprises four switches 826, 827, 828 and 829 controlled by a control circuit (not illustrated).

The switch 826 is controlled by a control signal Kcmp1 and is configured to couple the comparator input 315 to a first electrode of the capacitor Cvx, the second electrode of which is coupled to the inverting input 120 of the amplifier 124.

The switch 827 is controlled by a control signal KBcmp1, which is the inverse of the control signal Kcmp1, and is configured to couple the node 822 to the first electrode of the capacitor Cvx.

The switch 828 is controlled by the control signal KBcmp1 and is configured to couple the node 315 to a first electrode of the capacitor Crmpp, the second electrode of which is coupled to the inverting input 120 of the amplifier 124.

The switch 829, controlled by the control signal Kcmp1, is configured to couple the node 822 to the first electrode of the capacitor Crmpp.

Similarly, the swapping circuit 810 comprises four switches 816, 817, 818 and 819 controlled by the control circuit (not illustrated).

The switch 816 is controlled by a control signal Kcmp2, and is configured to couple the node 812 to a first electrode of the capacitor Crmpn, the second electrode of which is coupled to the non-inverting input 122 of the amplifier 124.

The switch 817 is controlled by a control signal KBcmp2, which is the inverse of the control signal Kcmp2, and is configured to couple the node 814 to the first electrode of the capacitor Crmpn.

The switch 818 is controlled by the control signal Kcmp2, and is configured to couple the node 812 to a first electrode of the capacitor Cvxp, the second electrode of which is coupled to the non-inverting input 122 of the amplifier 124.

The switch 819 is controlled by the control signal KBcmp2 and is configured to couple the node 814 to the first electrode of the capacitor Cvxp.

The capacitors Cvx and Crmpp are for example configured to have equal capacitances, for example to within normal manufacturing tolerances. Likewise, the capacitors Crmpn and Cvxp are for example configured to have equal capacitances, for example to within normal manufacturing tolerances.

The control circuit is, for example, configured to set a state of the switches 826, 827, 828 and 829 in a first configuration during a first time period and in a second configuration during a second time period. The first time period for example corresponds to a reading cycle of a first pixel of a pixel array and the second time period for example corresponds to a reading cycle of a second pixel of the pixel array, the first and second pixels being in the same column, meaning that they are read by the same column comparator. However, the first and second time periods are not necessarily consecutive reading cycles. The control circuit sets the switches between first and second configurations in order to swap, for example, the roles of capacitors Cvx and Crmpp.

Similarly, the control circuit is, for example, configured to set a state of the switches 816, 817, 818 and 819 in a first configuration during the first time period and in a second configuration during the second time period, or vice versa. The control circuit sets the switches between first and second configurations in order to swap, for example, the roles of capacitors Cvxp and Crmpn.

In the case that the signal VXP is generated by the voltage amplifier 710 of FIG. 7, the control circuit is also for example configured to control the switches of the swapping circuit 730 to have one of the configurations during the first time period, and the other configuration during the second time period, or vice versa.

Changing the state of the switches as a function of the cycles allows an averaging over time, for example, of the gain errors generated on each column of the pixel array and due to the capacitors mismatches.

According to an example, the switches 750 and 760 of FIG. 7; and the switches 770 and 780 of FIG. 7; the switches 826 and 827 of FIG. 8; the switches 828 and 829 of FIG. 8; the switches 816 and 817 of FIG. 8; and the switches 818 and 819 of FIG. 8, are respectively configured to operate in opposite phases to each other. Working in opposite phases means, for example, that two switches are controlled to have an opposite conduction state, one of the switches being conductive, and the other being non-conductive. The control circuit is for example configured to change pseudo-randomly, between successive time periods, the states of the switches of each swapping circuit 730, 810, 820 that are working in phase, the corresponding switches working in opposite phases being automatically switched in an inverse manner by conception. Such an example allows to overcome the creation of fixed pattern noise.

The implementation of the three swapping circuits 730, 810 and 820 in a same embodiment gives rise to eight possible switch configurations, as will now be described in more detail with FIG. 9.

Figure 9:
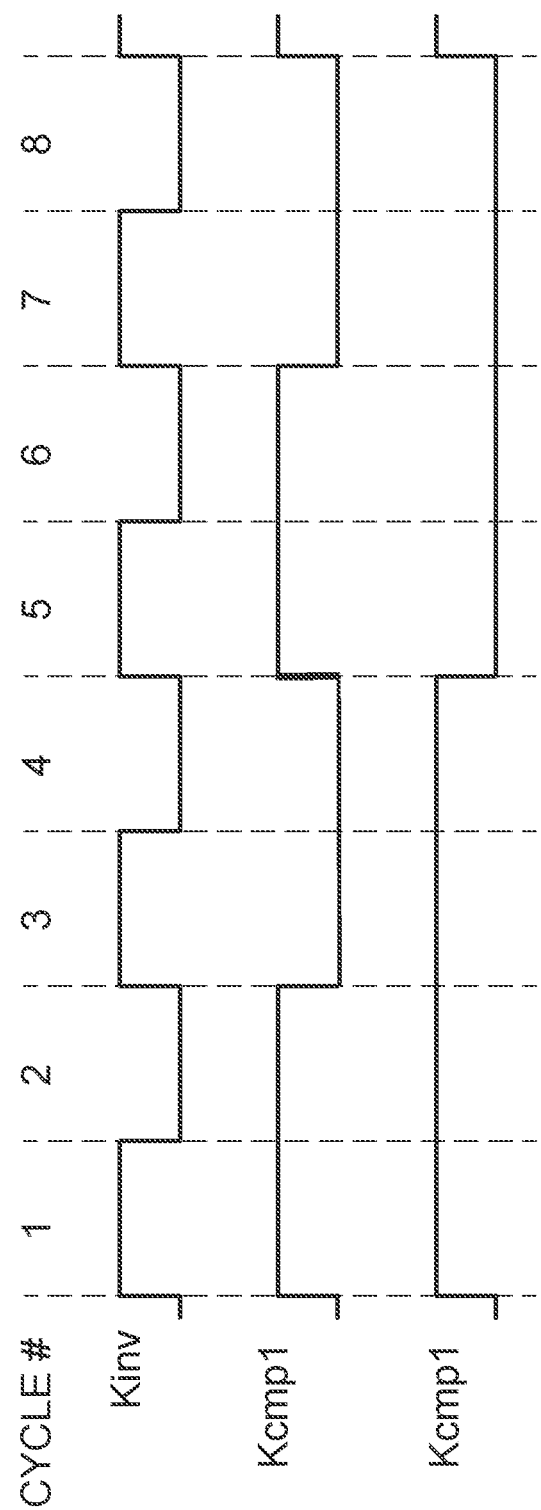
FIG. 9 is a configuration table representing switch control configurations of the differential comparator of FIG. 7 and FIG. 8.

FIG. 9 is a configuration table representing switch control configurations of the comparator circuit of FIG. 7 and FIG. 8. The example of FIG. 9 represents eight different possible states of control signals Kinv, Kcmp1 and Kcmp2. Since Kinv and KBinv; Kcmp1 and KBcmp1; and Kcmp2 and KBcmp2 are respectively hardware inverted, it is sufficient to only represent the control signal states Kinv, Kcmp1 and Kcmp2. The control circuit is programmed to pseudo-randomly apply these configurations on each cycle by shifting the control signals of the various switches. Since each of the three swapping circuits 730, 810 and 820 has two possible switch configurations, there are a total of eight possible switch configurations among the three swapping circuits.

In an example, the control circuit is configured to pseudo-randomly select the switch configuration of each swapping circuit 730, 810, 820 based on a same probability of occurrence of each of the two switch configurations, and/or to pseudo-randomly select the switch configuration of the set of three swapping circuit 730, 810, 820 based on the same probability of occurrence of each of the eight switch configurations.

Figure 10:
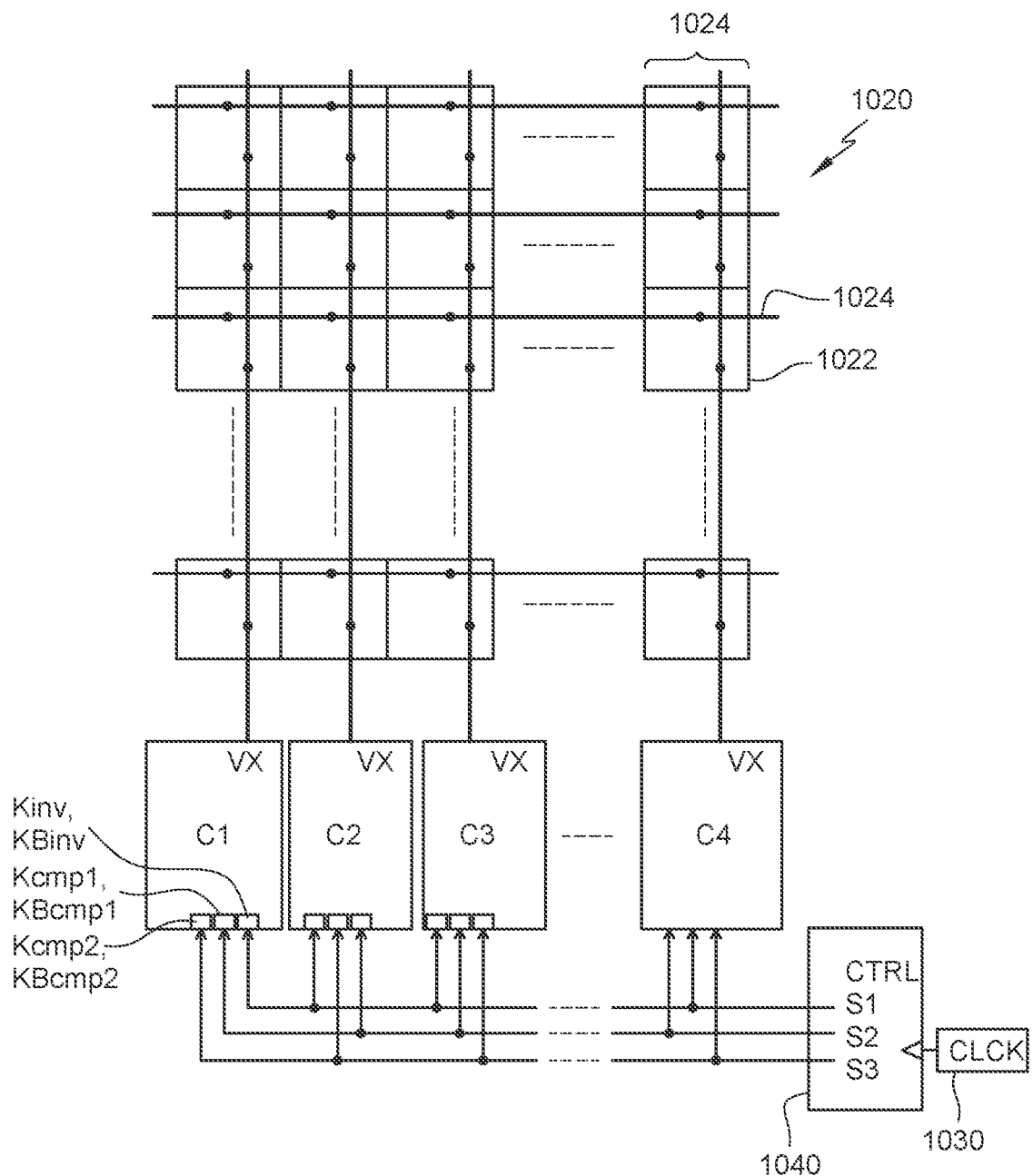
FIG. 10 schematically illustrates an electronic circuit comprising an array of pixels and the differential comparator of FIG. 3, 4 or 8 coupled to each column of the pixel array.

FIG. 10 schematically illustrates an electronic circuit 1020 comprising an array of pixels 1022 and comparators, noted C1, C2, C3, C4 in FIG. 10, coupled to each column 1024 of the pixel array. Each comparator is for example implemented by the comparator 800 of FIG. 8 comprising the voltage amplifier 710 of FIG. 7 for generating the inverted analog input signal VXP.

The electronic circuit 1020 for example comprises a control circuit CTRL 1040 for generating the control signal of the swapping circuits of the comparator. The control circuit CTRL 1040 is for example controlled by a clock signal CLCK 1030, and has output signal lines, each coupled in a scrambled manner to the switches of the comparator of each column.

In the example of FIG. 10, the control circuit 1040 has three output signal lines S1, S2, S3.

In the example of FIG. 10, the control line S1 is, for example, coupled to the switches 750, 760, 770, 780 of the comparator C1. In particular, the signal S1 for example drives the control signal Kinv, which automatically generates the control signal KBinv in the comparator C1. Furthermore, in the example of FIG. 10, the control signals Kinv and Kbinv in the comparators C2, C3 and C4 are respectively driven by the control signals S2, S3 and S3.

The control line S2 is, for example, coupled to the switches 826, 827, 828, 829 of the comparator C1. In particular, the signal S2 for example drives the control signal Kcmp1, which automatically generates the control signal KBcmp1 in the comparator C1. Furthermore, in the example of FIG. 10, the control signals Kcmp1 and KBcmp1 in the comparators C2, C3 and C4 are respectively driven by the control signals S3, S2 and S1.

The control line S3 is, for example, coupled to the switches 816, 817, 818, 819 of the comparator C1. In particular, the signal S3 for example drives the control signal Kcmp2, which automatically generates the control signal KBcmp2 in the comparator C1. Furthermore, in the example of FIG. 10, the control signals Kcmp2 and KBcmp2 in the comparators C2, C3 and C4 are respectively driven by the control signals S1, S1 and S2.

In an example, during each read cycle, a different pixel row of each column 1024 is read under the control of the clock signal CLCK. A signal corresponding to the pixel value is then sent on the input VX of the corresponding comparator. The control circuit 1040 provides control signals to the switches, for example according to the signals of FIG. 9, but according to a pseudo-random selection of the switch configurations.

In particular, according to an example, the control circuit 1040 modifies pseudo-randomly, between each reading cycle of the pixel rows, the state of the switches of the various comparators. In an example, the state of the switches is chosen to ensure that each state of the switches will have a similar probability of occurrence. This permits an averaging of the capacitor mismatches, leading to a reduction in the undesirable effects of these mismatches. The vertical fixed pattern noise VFPN may therefore be significantly reduced.

Various embodiments and variants have been described. Those skilled in the art will understand that certain features of these embodiments can be combined and other variants will readily occur to those skilled in the art. In particular, the embodiments of FIGS. 3 and 7 can be combined. In this case, the negative unitary amplifier 710 may be implemented in the comparator 300 of FIG. 3 by replacing the amplifier 325. Furthermore, the swapping circuits 810 or 820 may be implemented in the embodiment of FIG. 1, the comparator input 315 being coupled to the pixel output in FIG. 1, the node 822 being coupled to the ramp signal RMP in FIG. 1 and the capacitor Crmpp being replaced by the capacitor Crmp in FIG. 1.

Finally, the practical implementation of the embodiments and variants described herein is within the capabilities of those skilled in the art based on the functional description provided hereinabove. In particular, the examples described in relation with the Figures are related to the case where electrons are collected by the photodiode and thus negative charge is processed by the pixels. In the case where holes are collected by the photodiode and thus positive charge is processed by the pixels, the person skilled in the art will understand how to adapt the circuitry and timings accordingly. For example, in the case of holes, at the time t9, the pixel is read by asserting one of the further control signals CTRL, and the pixel output Vx will rise by the voltage difference ΔVX, which is a function of the signal captured by the pixel. Thus, the voltage at the first input INN would rise by a corresponding voltage difference ΔVX.

The invention claimed is:

1. An electronic circuit comprising a differential comparator circuit, the differential comparator circuit comprising:
a voltage amplifier of negative gain configured to receive an analog input signal and to generate an inverted analog input signal, wherein the analog input signal and the inverted analog input signal form differential analog input signals; and
a comparator input circuit comprising:
a first capacitive divider configured to generate a first signal as an average of the analog input signal and a first ramp signal; and
a second capacitive divider configured to generate a second signal as an average of the inverted analog input signal and a second ramp signal, wherein the first and second ramp signals are differential ramp signals;
wherein the differential comparator circuit is configured to compare the first signal with the second signal in order to generate a signal transition having a timing based on the analog input signal.

2. The electronic circuit according to claim 1, wherein the voltage amplifier is a capacitive voltage amplifier, and wherein the negative gain is a negative unitary gain.

3. The electronic circuit according to claim 1, wherein the voltage amplifier comprises:
an amplifying stage having an inverting input;
an input capacitor coupled between an input of the voltage amplifier receiving the analog input signal and the inverting input; and
a feedback capacitor coupled between the inverting input and an output of the voltage amplifier providing the inverted analog input signal;
wherein the input capacitor and the feedback capacitor having capacitances that are equal or substantially equal to each other.

4. The electronic circuit according to claim 3, wherein the voltage amplifier comprises a reset switch activated by a control unit, wherein said reset switch is coupled between the inverting input of the amplifying stage of the voltage amplifier and the output of the voltage amplifier.

5. The electronic circuit according to claim 1, wherein:
the first capacitive divider comprises: a first capacitor coupled between a first input node of the comparator input circuit receiving the analog input signal and a first output of the comparator input circuit providing the first signal; and a second capacitor coupled between a second input node of the comparator input circuit receiving the first ramp signal and the first output of the comparator input circuit; and
the second capacitive divider comprises: a third capacitor coupled between a third input node of the comparator input circuit receiving the inverted analog input signal and a second output of the comparator input circuit providing the second signal; and a fourth capacitor coupled between a fourth input node of the comparator input circuit receiving the second ramp signal and the second output of the comparator input circuit;
wherein the first, second, third and fourth capacitors all have the same, or substantially the same, capacitance.

6. The electronic circuit according to claim 1, wherein the comparator input circuit comprises:
an amplifier having an inverting input configured to receive the first signal, and a non-inverting input configured to receive the second signal; and
an initialization circuit configured to apply:
a common mode voltage to the non-inverting input of the amplifier; and
the common mode voltage between the inverting input and an output of the amplifier of the differential comparator circuit.

7. The electronic circuit according to claim 1, wherein the analog input signal is a pixel output signal of a pixel of an array of pixels.

8. The electronic circuit of claim 1,
wherein the differential comparator circuit is configured to define a first comparator;
further comprising a second comparator comprising a second differential comparator circuit, the second differential comparator circuit comprising:
a second voltage amplifier of negative gain configured to receive a second analog input signal and to generate a second inverted analog input signal, wherein the second analog input signal and the second inverted analog input signal form differential analog input signals; and
a second comparator input circuit comprising:
a third capacitive divider configured to generate a third signal as an average of the second analog input signal and a third ramp signal; and
a fourth capacitive divider configured to generate a fourth signal as an average of the second inverted analog input signal and a fourth ramp signal, wherein the third and fourth ramp signals are differential ramp signals;
the second differential comparator circuit being configured to compare the third signal with the fourth signal in order to generate a signal transition having a timing based on the second analog input signal; and
further comprising a matrix of pixels, the analog input signal of the first comparator being provided by a first pixel of a first column of the matrix, and the second analog input signal of the second comparator being provided by a second pixel of a second column of the matrix.

9. The electronic circuit of claim 1, configured to define an analog to digital converter comprising:
the differential comparator circuit; and
a time to digital converter configured to generate a digital output signal based on the timing of the signal transition.

10. An electronic circuit comprising a differential amplifier circuit, the differential amplifier circuit comprising:
a swapping circuit configured to couple, during a first time period, a first capacitor between a first input node and a common node and a second capacitor between a second node and the common node, and to couple, during a second time period, the first capacitor between the second node and the common node and the second capacitor between the first input node and the common node;
the swapping circuit comprising:
a first switch coupled between the first input node and a first electrode of the first capacitor;
a second switch coupled between the second node and the first electrode of the first capacitor;
a third switch coupled between the second node and a first electrode of the second capacitor; and
a fourth switch coupled between the first input node and the first electrode of the second capacitor,
wherein a second electrode of the first capacitor and a second electrode of the second capacitor are coupled to the common node; and
a control circuit configured to:
control, during the first time period, the first and third switches to be conductive and the second and fourth switches to be non-conductive; and
control, during the second time period, the second and fourth switches to be conductive and the first and third switches to be non-conductive, such that roles of the first and second capacitors are swapped between the first and second time periods.

11. The electronic circuit according to claim 10, wherein the control circuit is configured to control the switches over a succession of time periods, wherein during each time period of the succession, the control circuit is configured to perform the control of the first, second, third and fourth switches to select, pseudo-randomly, either a switch configuration corresponding to the first time period or a switch configuration corresponding to the second time period, the selection being kept constant during each time period.

12. The electronic circuit according to claim 10,
further comprising a differential comparator circuit, the differential comparator circuit comprising:
a voltage amplifier of negative gain configured to receive an analog input signal and to generate an inverted analog input signal, wherein the analog input signal and the inverted analog input signal form differential analog input signals; and
a comparator input circuit comprising:
a first capacitive divider configured to generate a first signal as an average of the analog input signal and a first ramp signal;
the first capacitive divider comprising: a first capacitor coupled between a first input node of the comparator input circuit receiving the analog input signal and a first output of the comparator input circuit providing the first signal; and a second capacitor coupled between a second input node of the comparator input circuit receiving the first ramp signal and the first output of the comparator input circuit; and
a second capacitive divider configured to generate a second signal as an average of the inverted analog input signal and a second ramp signal, wherein the first and second ramp signals are differential ramp signals;
the second capacitive divider comprising: a third capacitor coupled between a third input node of the comparator input circuit receiving the inverted analog input signal and a second output of the comparator input circuit providing the second signal; and a fourth capacitor coupled between a fourth input node of the comparator input circuit receiving the second ramp signal and the second output of the comparator input circuit, wherein the first, second, third and fourth capacitors all have the same, or substantially the same, capacitance;
the differential comparator circuit being configured to compare the first signal with the second signal in order to generate a signal transition having a timing based on the analog input signal; and
wherein:
the first and second capacitors coupled to the swapping circuit are the first and second capacitors respectively of the first capacitive divider;
the first node of the swapping circuit is the first input node configured to receive the analog input signal, the of the swapping circuit is the second input node configured to receive the first ramp signal, and the common node of the swapping circuit is the first output providing the first signal;
the first and second capacitors coupled to the second swapping circuit are the third and fourth capacitors respectively of the second capacitive divider; and
the first node of the second swapping circuit is the third input node configured to receive the inverted analog input signal, the second node of the swapping circuit is the fourth input node configured to receive the second ramp signal, and the common node of the swapping circuit is the second output providing the second signal.

13. The electronic circuit according to claim 10,
further comprising a differential comparator circuit comprising:
- a voltage amplifier of negative gain configured to receive an analog input signal and to generate an inverted analog input signal, wherein the analog input signal and the inverted analog input signal form differential analog input signals; and
- a comparator input circuit comprising:
- a first capacitive divider configured to generate a first signal as an average of the analog input signal and a first ramp signal; and
- a second capacitive divider configured to generate a second signal as an average of the inverted analog input signal and a second ramp signal, wherein the first and second ramp signals are differential ramp signals;
- the differential comparator circuit being configured to compare the first signal with the second signal in order to generate a signal transition having a timing based on the analog input signal;
- wherein the voltage amplifier comprises a reset switch activated by a control unit, and coupled between an inverting input of the voltage amplifier and an output of the voltage amplifier; and wherein:
- the first capacitor coupled to the swapping circuit is an input capacitor;
- the second capacitor coupled to the swapping circuit is a feedback capacitor; and
- the first input node of the swapping circuit is an input of the voltage amplifier receiving the analog input signal, the second node of the swapping circuit is the output of the voltage amplifier providing the inverted analog input signal, and the common node of the swapping circuit is the inverting input.

14. A method of differential comparison, comprising:
- receiving, by a voltage amplifier of negative gain, an analog input signal and generating, by the voltage amplifier, an inverted analog input signal, wherein the analog input signal and the inverted analog input signal form differential analog input signals;
- generating, by a first capacitive divider of a comparator input circuit, a first signal as an average of the analog input signal and a first ramp signal;
- generating, by a second capacitive divider of the comparator input circuit, a second signal as an average of the inverted analog input signal and a second ramp signal, wherein the first and second ramp signals are differential ramp signals; and
- comparing, the first signal with the second signal to generate a signal transition at a time based on the analog input signal.

* * * * *